United States Patent
Lin et al.

(10) Patent No.: US 8,791,528 B2
(45) Date of Patent: Jul. 29, 2014

(54) METHODS OF MANUFACTURING METAL-SILICIDE FEATURES

(75) Inventors: Chen-Tung Lin, Hsin-Chu (TW); Chih-Wei Chang, Hsin-Chu (TW); Chii-Ming Wu, Taipei (TW); Mei-Yun Wang, Hsin-Chu (TW); Chaing-Ming Chuang, Changhua (TW); Shau-Lin Shue, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 102 days.

(21) Appl. No.: 12/861,358

(22) Filed: Aug. 23, 2010

(65) Prior Publication Data

US 2010/0314698 A1    Dec. 16, 2010

Related U.S. Application Data

(62) Division of application No. 11/838,376, filed on Aug. 14, 2007, now Pat. No. 7,781,316, which is a division of application No. 10/872,343, filed on Jun. 18, 2004, now Pat. No. 7,268,065.

(51) Int. Cl.
   *H01L 29/78*    (2006.01)
   *H01L 29/66*    (2006.01)

(52) U.S. Cl.
   CPC ....... *H01L 29/66545* (2013.01); *Y10S 438/926* (2013.01)
   USPC ............. 257/412; 257/413; 257/E29.112; 257/E29.135; 257/E29.156; 438/592; 438/926

(58) Field of Classification Search
   CPC ................................. H01L 29/66545
   USPC ........... 257/412, 413, E29.111, E29.112, 257/E29.128, E29.135, E29.156; 438/926, 438/592
   See application file for complete search history.

(56) References Cited

U.S. PATENT DOCUMENTS

| | | | |
|---|---|---|---|
| 4,249,968 A * | 2/1981 | Gardiner et al. | 438/592 |
| 4,424,101 A | 1/1984 | Nowicki | |
| 4,584,760 A * | 4/1986 | Okazawa | 438/592 |
| 4,837,609 A * | 6/1989 | Gurvitch et al. | 257/43 |
| 5,162,884 A | 11/1992 | Liou et al. | |
| 5,391,510 A | 2/1995 | Hsu et al. | |
| 5,585,304 A | 12/1996 | Hayashi et al. | |
| 5,635,765 A * | 6/1997 | Larson | 257/768 |
| 5,767,558 A * | 6/1998 | Lo et al. | 257/412 |
| 5,780,331 A | 7/1998 | Liaw et al. | |
| 5,840,607 A * | 11/1998 | Yeh et al. | 438/257 |
| 5,861,675 A | 1/1999 | Sasaki et al. | |
| 5,877,074 A * | 3/1999 | Jeng et al. | 438/592 |
| 5,907,784 A * | 5/1999 | Larson | 438/592 |

(Continued)

OTHER PUBLICATIONS

Shuming, Xu, et al., "High Performance RF Power LDMOSFET Technology for 2.1GHz Power Amplifier Application," Microwave Symposium Digest, 2003 IEEE MTT-S International, vol. 1, Jun. 8-13, 2003, pp. 217-220.

*Primary Examiner* — Mary Wilczewski
(74) *Attorney, Agent, or Firm* — Haynes and Boone, LLP

(57) ABSTRACT

A method of manufacturing a microelectronic device including forming a dielectric layer surrounding a dummy feature located over a substrate, removing the dummy feature to form an opening in the dielectric layer, and forming a metal-silicide layer conforming to the opening. The metal-silicide layer may then be annealed.

20 Claims, 11 Drawing Sheets

(56) References Cited

U.S. PATENT DOCUMENTS

| | | | |
|---|---|---|---|
| 5,958,508 A * | 9/1999 | Adetutu et al. | 427/248.1 |
| 5,960,270 A * | 9/1999 | Misra et al. | 438/197 |
| 5,969,422 A | 10/1999 | Ting et al. | |
| 5,972,785 A | 10/1999 | Shishiguchi | |
| 5,990,015 A | 11/1999 | Lin et al. | |
| 6,117,739 A | 9/2000 | Gardner | |
| 6,127,262 A | 10/2000 | Huang et al. | |
| 6,130,144 A | 10/2000 | Verret | |
| 6,180,465 B1 | 1/2001 | Gardner | |
| 6,204,137 B1 | 3/2001 | Teo et al. | |
| 6,209,484 B1 | 4/2001 | Huang et al. | |
| 6,245,673 B1 * | 6/2001 | Okubo et al. | 438/649 |
| 6,251,731 B1 | 6/2001 | Wu | |
| 6,262,485 B1 | 7/2001 | Thakur et al. | |
| 6,310,367 B1 | 10/2001 | Yagishita et al. | |
| 6,355,553 B1 | 3/2002 | Shinohara | |
| 6,436,840 B1 | 8/2002 | Besser et al. | |
| 6,440,867 B1 | 8/2002 | Besser et al. | |
| 6,515,320 B1 | 2/2003 | Azuma et al. | |
| 6,528,362 B1 | 3/2003 | Besser et al. | |
| 6,531,395 B1 | 3/2003 | Hou et al. | |
| 6,562,718 B1 * | 5/2003 | Xiang et al. | 438/682 |
| 6,602,781 B1 | 8/2003 | Xiang et al. | |
| 6,649,462 B2 | 11/2003 | Azuma et al. | |
| 6,730,584 B2 | 5/2004 | Schuegraf et al. | |
| 6,740,585 B2 * | 5/2004 | Yoon et al. | 438/680 |
| 6,753,260 B1 | 6/2004 | Li et al. | |
| 7,015,126 B2 * | 3/2006 | Wu et al. | 438/592 |
| 7,205,612 B2 * | 4/2007 | Cai et al. | 257/355 |
| 7,241,674 B2 * | 7/2007 | Chan et al. | 438/592 |
| 7,268,065 B2 * | 9/2007 | Lin et al. | 438/510 |
| 7,291,526 B2 * | 11/2007 | Li | 438/197 |
| 7,326,610 B2 * | 2/2008 | Amos et al. | 438/231 |
| 7,332,388 B2 * | 2/2008 | Trivedi et al. | 438/199 |
| 7,416,949 B1 * | 8/2008 | Pas et al. | 438/275 |
| 7,545,006 B2 * | 6/2009 | Chen et al. | 257/382 |
| 7,638,427 B2 * | 12/2009 | Froment et al. | 438/649 |
| 7,754,593 B2 * | 7/2010 | Saito | 438/585 |
| 7,781,316 B2 * | 8/2010 | Lin et al. | 438/583 |
| 7,820,546 B2 * | 10/2010 | Jung et al. | 438/630 |
| 8,012,817 B2 * | 9/2011 | Masuoka et al. | 438/197 |
| 8,187,970 B2 * | 5/2012 | Ganguli et al. | 438/655 |
| 8,202,799 B2 * | 6/2012 | Lin et al. | 438/664 |
| 8,237,221 B2 * | 8/2012 | Yagi et al. | 257/330 |
| 8,294,274 B2 * | 10/2012 | Liu et al. | 257/774 |
| 8,343,826 B2 * | 1/2013 | Kronholz et al. | 438/217 |
| 8,569,135 B2 * | 10/2013 | Guo et al. | 438/275 |
| 2002/0019102 A1 | 2/2002 | Ang et al. | |
| 2002/0019127 A1 | 2/2002 | Givens | |
| 2005/0145893 A1 * | 7/2005 | Doczy et al. | 257/288 |
| 2006/0118890 A1 * | 6/2006 | Li | 257/410 |
| 2006/0263961 A1 * | 11/2006 | Kittl et al. | 438/199 |
| 2008/0122018 A1 * | 5/2008 | Lin et al. | 257/412 |
| 2008/0191289 A1 * | 8/2008 | Pas et al. | 257/401 |
| 2008/0237750 A1 * | 10/2008 | Tsai et al. | 257/412 |
| 2013/0020658 A1 * | 1/2013 | Guo et al. | 257/412 |

* cited by examiner

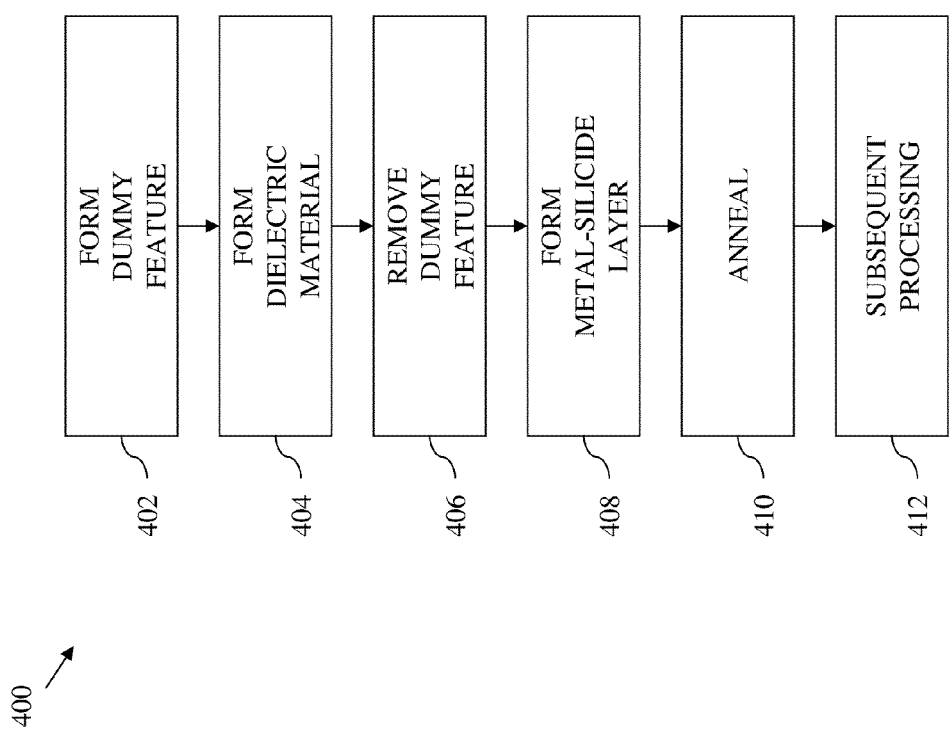

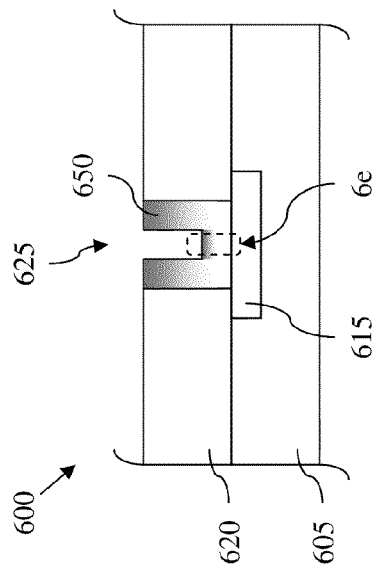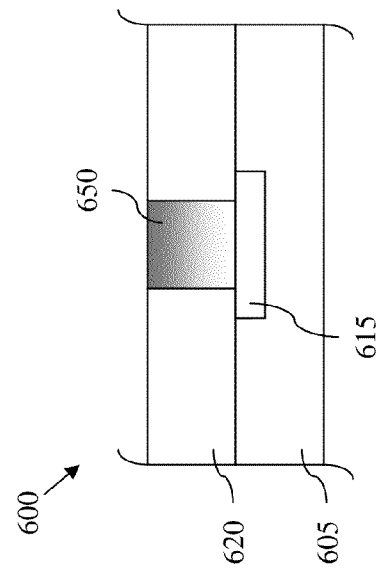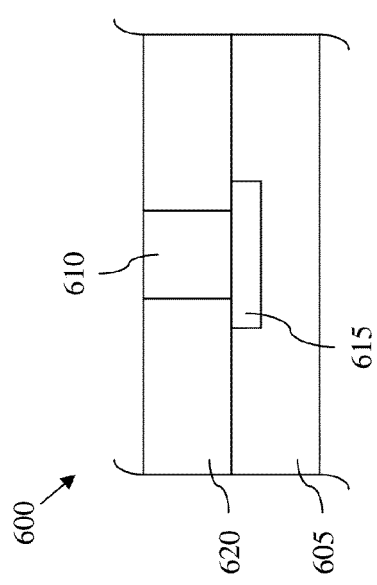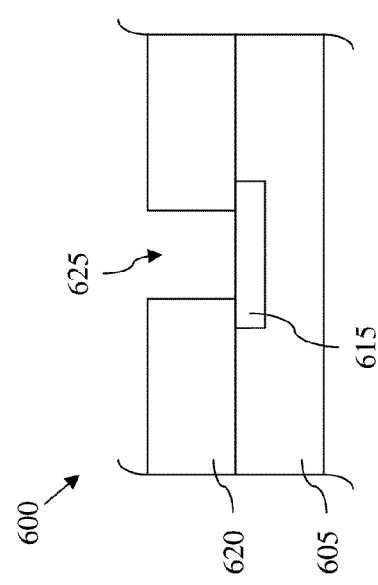

METHODS OF MANUFACTURING METAL-SILICIDE FEATURES

This application is a divisional of U.S. patent application Ser. No. 11/838,376, filed Aug. 14, 2007, which is a divisional of U.S. patent application Ser. No. 10/872,343, filed Jun. 18, 2004, now U.S. Pat. No. 7,268,065, the entire disclosures of which are hereby incorporated by reference. This application is related to U.S. patent application Ser. No. 12/833,595, filed Jul. 9, 2010, the entire disclosure of which is hereby incorporated by reference.

BACKGROUND

One process by which a transistor gate is formed includes forming a dummy gate and a dielectric layer around the dummy gate. The dummy gate is then removed, exposing a portion of the underlying substrate through the resulting opening in the dielectric layer. A gate dielectric layer is then formed on the substrate in the opening, and an amorphous silicon layer is deposited on the gate dielectric layer and the sidewalls of the dielectric layer opening. A separate metal layer is then deposited over the amorphous silicon, and an annealing treatment is performed to react the metal with the amorphous silicon to form a metal silicide layer overlying the gate dielectric layer.

However, forming a transistor gate in such manner results in a gate electrode having a work function that is substantially equal to the work function of a polysilicon gate electrode, at least partially due to the existence of an unreacted portion of the amorphous silicon near the gate dielectric layer. In many applications, it is desirable to form gate electrodes of varying work function levels. The remaining amorphous silicon is also highly resistive, and results in an increased effective oxide thickness (EOT). Such a process is also complicated, requiring numerous time- and cost-intensive process steps.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4 is a flow chart diagram of another embodiment of a method of manufacturing a metal-silicide feature according to aspects of the present disclosure.

FIGS. 6a-6f are sectional views of at least a portion of another embodiment of a metal-silicide feature during various stages of manufacture according to aspects of the present disclosure.

DETAILED DESCRIPTION

Figure 1:
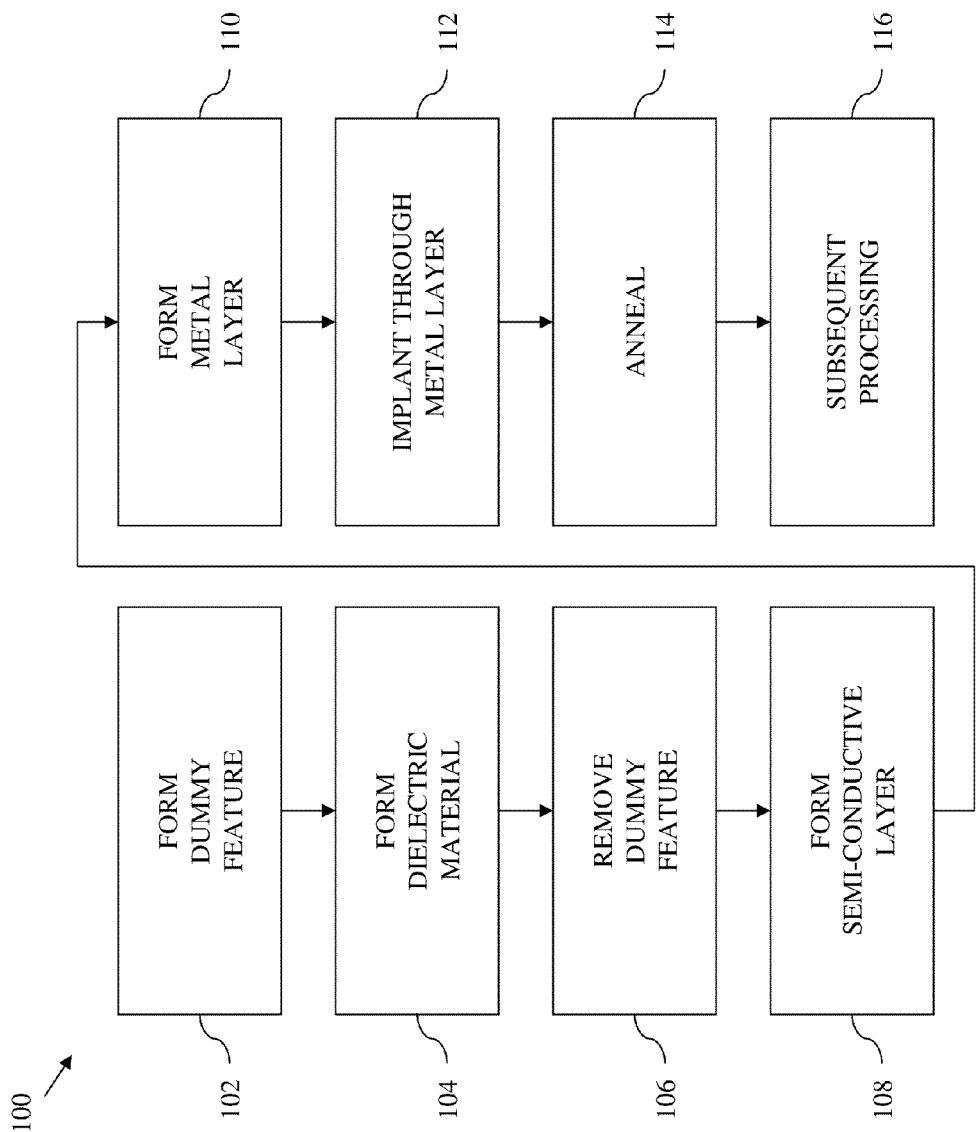
FIG. 1 illustrates a flow chart diagram of one embodiment of a method of manufacturing a metal-silicide feature according to aspects of the present disclosure.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a flow chart diagram of one embodiment of a method 100 of manufacturing a metal-silicide feature according to aspects of the present disclosure. The method 100 includes a step 102 in which a dummy feature is formed over a substrate. The dummy feature may have dimensions that are substantially similar or proportional to those of t metal-silicide feature to be formed. The dummy feature may comprise any material that is selectively etchable or otherwise selectively removable relative to previously or subsequently formed proximate materials.

The method also includes a step 104 in which dielectric material is formed around the dummy feature. The dielectric material may be formed in one or more layers, and may include spacers, such as may be employed to electrically isolate previously or subsequently formed features proximate the metal-silicide feature being formed in accord with the method 100. The dielectric material formed in step 104 may also be formed prior to forming the dummy feature in step 102, such that the dummy feature may be formed in an opening in the dielectric material. The dielectric material may comprise silicon dioxide, fluorinated silicon glass (FSG), silicon oxynitride, and/or other insulating materials. The thickness of the dielectric material over the substrate may be substantially similar to the thickness of the dummy feature formed in step 102.

In a step 106, the dummy feature formed in step 102 is removed. For example, one or more wet and/or dry etching processes, chemical etches, and/or plasma etches may be employed to remove the dummy feature, thereby leaving an opening in the dielectric material, possibly exposing a portion of the substrate through the opening. In one embodiment, a dielectric layer may be formed over the exposed portion of the substrate. For example, in embodiments in which the metal-silicide feature being formed is a transistor gate electrode, a gate dielectric layer may be grown or otherwise formed over the substrate and within the opening.

The opening may be lined with one or more layers of amorphous silicon and/or other semiconductive materials in a step 108, including the portion of the substrate previously exposed in step 106, or the dielectric layer formed over the exposed substrate portion. The semiconductive material may be formed in the opening, and possibly over the dielectric material outside of the opening, by chemical vapor deposition (CVD), plasma-enhanced CVD (PECVD), physical vapor deposition (PVD), atomic layer deposition (ALD), and/or other processes.

A metal layer may be formed in a step 110. The metal layer may be a metal lining substantially conforming to the previously formed semiconductive lining in the dielectric material opening. However, the metal layer may also substantially fill the opening. The metal layer may also be formed over the dielectric material and/or semiconductive layer outside of the opening, possibly by CVD, PECVD, PVD, ALD, and/or other processes.

An implant process may be employed in a step 112 to implant impurities through the metal layer and into the semiconductive layer. Such impurities may comprise N type impurities, including phosphorous, arsenic, antimony, and/or other materials, and/or P type impurities, including boron, boron fluoride, indium, and/or other materials. The impurities may be implanted at a dosage ranging between about $1 \times 10^{14}$ atoms/cm$^2$ and about $1 \times 10^{17}$ atoms/cm$^2$ and at an implant energy ranging between about 5 keV and about 40 keV. In one embodiment, a mask may be employed to shield all but the dielectric material opening and its contents from the implant process.

The implant process employed in step 112 may establish a conductivity gradient in the semiconductive layer. For example, the semiconductive layer may be more conductive near the interface with the metal layer compared to near the interface with the substrate or dielectric layer formed over the substrate in the opening. An anneal process may be performed in a step 114 to more uniformly distribute the implanted impurities, or to decrease the conductivity gradient, possibly by driving a portion of the implanted impurities away from the metal layer and towards the substrate. The anneal process may be or comprise a rapid thermal anneal and/or furnace anneal, one or more of which may be performed at temperatures ranging between about 400° C. and about 800° C., possibly for a time period ranging between about 10 seconds and about 1 hour. The anneal may be performed in an inert process environment, such as one substantially comprising nitrogen, argon, helium, and/or other gases. A sintering process may also or alternatively be employed to migrate impurities within the semiconductive layer.

Subsequent processing may then be performed, as represented by step 116 in FIG. 1. For example, step 116 may represent one or more chemical mechanical polishing or chemical mechanical planarizing (hereafter collectively referred to as CMP) processes, etch-back processes, deposition processes, and/or other processes.

Figure 2C:
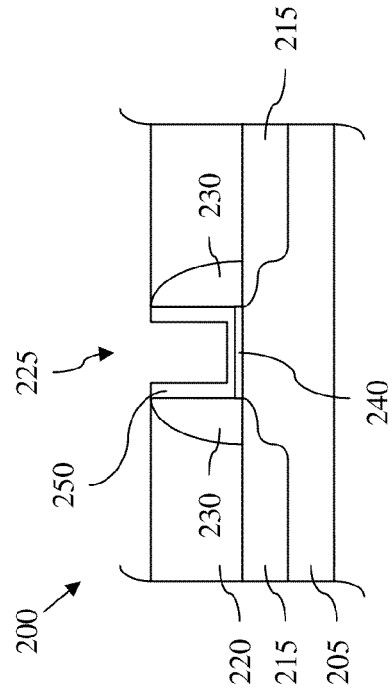
FIGS. 2a-2h are sectional views of at least a portion of one embodiment of a microelectronic device during various stages of manufacture according to aspects of the present disclosure.
Figure 2D:
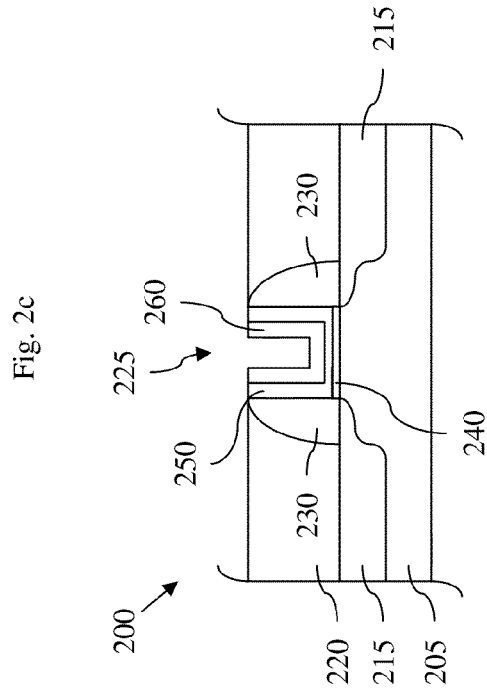
Figure 2A:
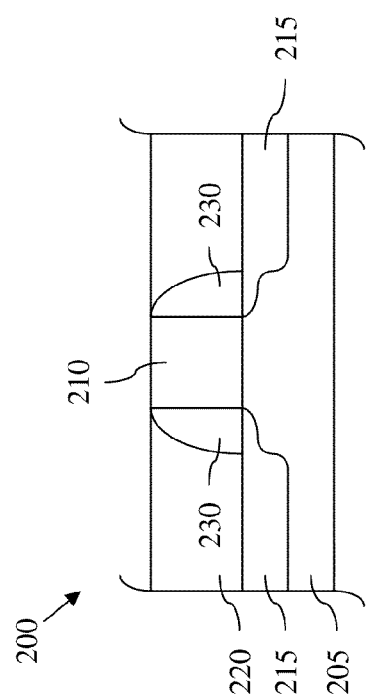

Referring to FIG. 2a, illustrated is a sectional view of at least a portion of one embodiment of a microelectronic device 200 in an intermediate stage of manufacture according to aspects of the present disclosure. The microelectronic device 200 is one environment in which the method 100 shown in FIG. 1 may be employed. For example, the microelectronic device 200 may be or comprise a metal-oxide semiconductor (MOS) device, and the method 100 of FIG. 1 may be employed during the fabrication of at least a portion of the gate electrode of the MOS device.

The microelectronic device 200 includes a substrate 205 over which a dummy feature 210 and a dielectric layer 220 are formed. In the illustrated embodiment, the dummy feature 210 is a dummy gate 210, and source/drain regions 215 are formed in the substrate 205 on opposing sides of the dummy gate 210. The microelectronic device 200 may also include spacers 230 formed on opposing sides of the dummy gate 210, or a single spacer 230 substantially surrounding the dummy gate 210.

The substrate 205 may comprise silicon, gallium arsenide, gallium nitride, strained silicon, silicon germanium, silicon carbide, carbide, diamond, and/or other materials. A bulk portion of the substrate 205 may be doped with a P type and/or an N type dopant. In one embodiment, the substrate 205 comprises a silicon-on-insulator (SOI) substrate, such as a silicon-on-sapphire substrate, a silicon germanium-on-insulator substrate, or another substrate comprising an epitaxial semiconductor layer on an insulator layer. The substrate 205 may also or alternatively comprise a fully depleted SOI substrate having an active layer thickness ranging between about 5 nm and about 200 nm. The substrate 205 may also or alternatively comprise an air gap, such as may be formed in a "silicon-on-nothing" (SON) structure.

The dummy gate 210 may comprise one or more layers of conductive, semiconductive, or insulating materials. In one embodiment, the dummy gate 210 comprises polysilicon. The dummy gate 210 may be formed by CVD, PECVD, PVD, ALD, and/or other processes. The dummy gate 210 may be selectively deposited, such as in the shape illustrated in FIG. 2a, or blanket deposited and subsequently patterned by one or more etching or photolithographic processes. The dummy gate 210 may be formed prior to or after the dielectric layer 220 and/or the spacers 230. The dimensions of the dummy gate 210 may be substantially similar or proportional to the dimensions of a subsequently formed gate electrode. In one embodiment, the dummy gate 210 may not be formed, wherein the subsequently formed gate electrode is formed within an opening in the dielectric layer 220 and/or spacers 230 formed by other processes.

The source/drain regions 215 may be N doped or P doped regions of the substrate 205, and may be formed by one or more implant processes. For example, a first implant process may be employed to form lightly doped regions extending under the spacers 230, and a second implant process may be employed to form heavier doped regions to be contacted by subsequently formed vias, contacts, or other interconnects. An anneal process may also be employed to laterally diffuse the source/drain regions 215 inward towards the subsequently formed gate electrode.

The dielectric layer 220 and/or the spacers 230 may comprise silicon dioxide, fluorinated silicon glass (FSG), SILK (a product of Dow Chemical of Michigan), BLACK DIAMOND (a product of Applied Materials of Santa Clara, Calif.), and/or other insulating materials, and may be formed by CVD, ALD, PVD, spin-on coating, and/or other processes. The spacers 230 may also be shaped by one or more wet and/or dry etching processes, and may be formed as an intermediate step between multiple implant steps performed to form the source/drain regions 215.

Figure 2B:
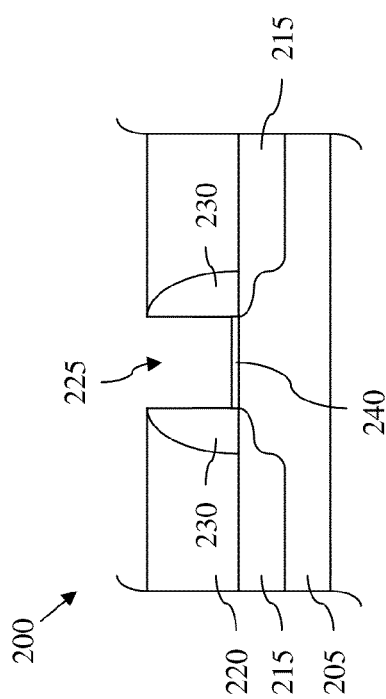

Referring to FIG. 2b, illustrated is a sectional view of the microelectronic device 200 shown in FIG. 2a in a subsequent stage of manufacture according to aspects of the present disclosure in which the dummy gate 210 has been removed, leaving an opening 225 in the dielectric layer 220. A gate dielectric layer 240 has also been formed over an exposed portion of the substrate 205 in the opening 225.

The dummy gate 210 may be removed by one or more wet and/or dry etching processes, chemical etches, and/or plasma etches. Such processing may etch away a substantial portion of the dummy gate 210 while substantially leaving the dielectric layer 220 and spacers 230 in their as-formed configuration. The dummy gate 210 may also be removed by micromachining, focused ion beam milling, and/or other processes.

The gate dielectric layer 240 may comprise silicon dioxide epitaxially grown from the substrate 205. For example, after the dummy gate 210 has been removed, the exposed portion of the substrate 205 may be cleaned, such as by a deionized water rinse, ashing, or acid solution etching, and the device 200 may be exposed to an oxygen or oxygen-containing environment or process gas, thereby growing a thin layer of silicon dioxide over the substrate 205. Of course, the gate dielectric layer 240 may be formed by one or more additional or alternative processes, and may comprise materials other than or in addition to silicon dioxide, such as silicon nitride, silicon oxynitride, and/or other materials. The gate dielectric layer 240 may also comprise more than one layer.

Referring to FIG. 2c, illustrated is a sectional view of the microelectronic device 200 shown in FIG. 2b in a subsequent stage of manufacture according to aspects of the present disclosure in which a semiconductive layer 250 has been formed substantially conforming to the opening 225. The semiconductive layer 250 may have a substantially U-shaped profile within the opening 225. The semiconductive layer 250 may comprise amorphous silicon, polysilicon, polyoxide, silicon nitride, silicon dioxide, silicon carbide, photoresist, and/or other materials, and may be formed by CVD, PECVD, PVD, ALD, and/or other processes. The semiconductive layer 250 may also be formed over the dielectric layer 220 and subsequently planarized (e.g., by CMP), etched-back, or otherwise removed except from within the opening 225. The semiconductive layer 250 may also comprise more than one layer.

Referring to FIG. 2d, illustrated is a sectional view of the microelectronic device 200 shown in FIG. 2c in a subsequent stage of manufacture according to aspects of the present disclosure in which a metal layer 260 has been formed, substantially conforming to the semiconductive layer 250. The metal layer 260 may have a substantially U-shaped profile within the opening 225. The metal layer 260 may comprise cobalt, nickel, tungsten, vanadium, bismuth, titanium, tantalum, aluminum, platinum, palladium, silicide, cobalt silicide, nickel silicide, platinum silicide, palladium silicide, tungsten silicide, alloys thereof, and/or other materials, and may be formed by CVD, PECVD, PVD, ALD, electroplating, and/or other processes. The metal layer 260 may also be formed over the dielectric layer 220 and subsequently planarized (e.g., by CMP), etched-back, or otherwise removed except from within the opening 225. Although not illustrated as such, the metal layer 260 may also substantially fill the opening 225. The metal layer 260 may also comprise more than one layer. In one embodiment, the collective thickness of the semiconductive layer 250 and the metal layer 260 within the opening is substantially less than a width of the opening 225.

Figure 2G:
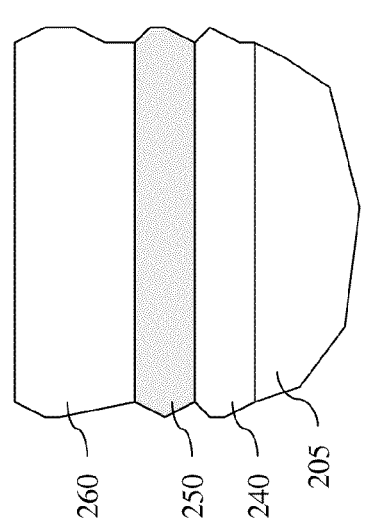
Figure 2H:
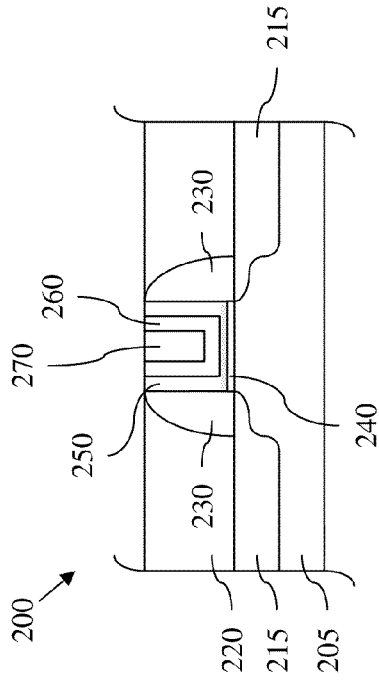
Figure 2E:
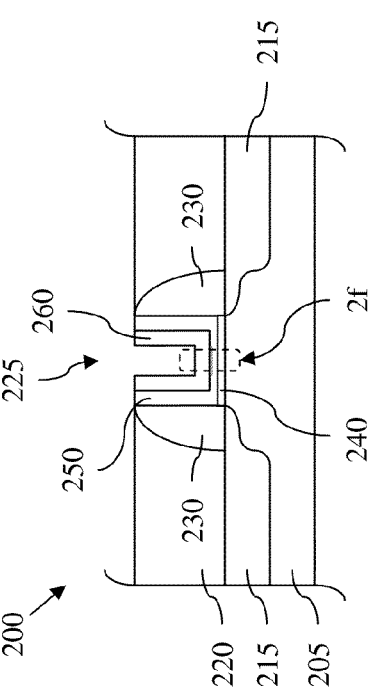

Referring to FIG. 2e, illustrated is a sectional view of the microelectronic device 200 shown in FIG. 2d in a subsequent stage of manufacture according to aspects of the present disclosure in which an ion implant process has been performed to implant impurities into the semiconductive layer 250 through the metal layer 260. The implant process may be substantially similar to the process performed in step 112 shown in FIG. 1. The implant process may also comprise more than one implant process of one or more impurity materials.

Figure 2F:
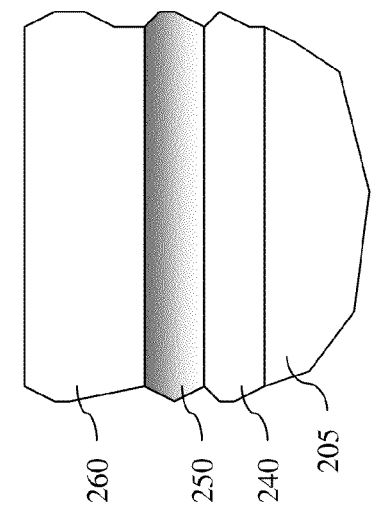

Referring to FIG. 2f, illustrated is an expanded view of a portion of the microelectronic device 200 shown in FIG. 2e. The impurities implanted through the metal layer 260 may not be implanted uniformly through the thickness of the semiconductive layer 250, as shown in FIG. 2f. For example, the impurities implanted into the semiconductive layer 250 may be more concentrated near the interface with the metal layer 260 relative to the concentration near the interface with the gate dielectric layer 240.

Referring to FIG. 2g, illustrated is an expanded view of the portion of the microelectronic device 200 shown in FIG. 2f after an anneal process is performed to more uniformly distribute the implanted impurities throughout a greater portion of the thickness of the semiconductive layer 250. In one embodiment, the concentration uniformity of the impurities within at least the portion of the annealed semiconductive layer 250 directly interposing the metal layer 260 and the gate dielectric layer 240 may vary by less than about 20%. For example, the concentration within any predetermined volumetric portion of the region interposing the metal layer 260 and the gate dielectric layer 240 may not vary from the average concentration within the region by more than about 20%. In one embodiment, the predetermined volumetric portion of the region may be represented by a cube having side dimensions of about 0.1 µm or more.

Referring to FIG. 2h, illustrated is a sectional view of the microelectronic device 200 in a subsequent stage of manufacture according to aspects of the present disclosure in which one or more subsequent processes have been performed to complete or advance the manufacturing of the device 200. For example, in the illustrated embodiment, the opening 225 has been filled with a plug 270 comprising conductive material, such as may be employed to form a contact to interconnects or other overlying features. Of course, the present disclosure is not limited to such subsequent processing. That is, FIG. 2h is provided to demonstrate, among other things, that the microelectronic device 200 is not necessarily completed after the processing depicted in FIG. 2g.

Figure 3A:
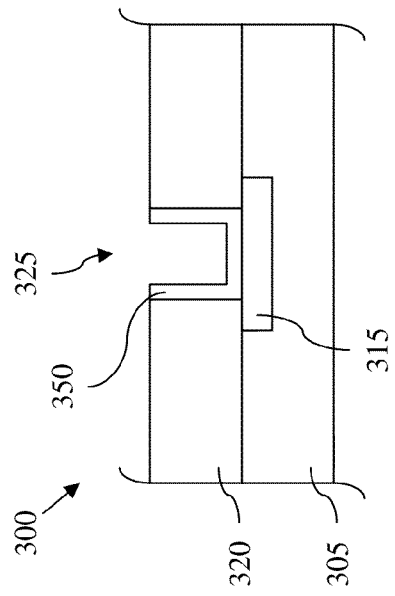
FIGS. 3a-3h are sectional views of at least a portion of one embodiment of a metal-silicide feature during various stages of manufacture according to aspects of the present disclosure.

Referring to FIG. 3a, illustrated is a sectional view of at least a portion of one embodiment of a microelectronic device 300 in an intermediate stage of manufacture according to aspects of the present disclosure. The microelectronic device 300 is another environment in which the method 100 shown in FIG. 1 may be employed. For example, the microelectronic device 300 includes a metal-silicide feature (shown in subsequent figures), and the method 100 of FIG. 1 may be employed during the fabrication of at least a portion of the metal-silicide feature.

The microelectronic device 300 includes a substrate 305 over which a dummy feature 310 and a dielectric layer 320 are formed. In the illustrated embodiment, the dummy feature 310 is a dummy contact 310, and a landing pad 315 is formed in the substrate 305 underlying the dummy contact 310. The landing pad 315 may also be a contact area of a microelectronic device, such as a source/drain contact of a transistor device.

The substrate 305 may comprise silicon, gallium arsenide, gallium nitride, strained silicon, silicon germanium, silicon carbide, carbide, diamond, and/or other materials. A bulk portion of the substrate 305 may be doped with a P type and/or an N type dopant. In one embodiment, the substrate 305 comprises an SOI substrate, such as a silicon-on-sapphire substrate, a silicon germanium-on-insulator substrate, or another substrate comprising an epitaxial semiconductor layer on an insulator layer. The substrate 305 may also or alternatively comprise a fully depleted SOI substrate having an active layer thickness ranging between about 5 nm and about 200 nm. The substrate 305 may also or alternatively comprise an air gap, such as may be formed in an SON structure. The substrate 305 may also comprise one or more layers of conductive vias, contacts, lines and/or traces extending along and/or through one or more dielectric layers, such as may be employed in an interconnect structure. The landing pad 315 may be integral to or coupled to one such conductive via, contact, line, or trace.

The dummy feature 310 may comprise one or more layers of conductive, semiconductive, or insulating materials. In one embodiment, the dummy feature 310 comprises polysilicon. The dummy feature 310 may be formed by CVD, PECVD, PVD, ALD, and/or other processes. The dummy feature 310 may be selectively deposited, such as in the shape illustrated in FIG. 3a, or blanket deposited and subsequently patterned by one or more etching or photolithographic processes. The dummy feature 310 may also be formed by damascene or dual-damascene processes, and may be formed prior to or after the dielectric layer 320. The dimensions of the dummy feature 310 may be substantially similar or proportional to the dimensions of the subsequently formed metal-silicide feature. In one embodiment, the dummy feature 310 may not be formed, wherein the subsequently formed metal-silicide feature is formed within an opening in the dielectric layer 320 that is formed by other processes.

The dielectric layer 320 may comprise silicon dioxide, FSG, SILK, BLACK DIAMOND, and/or other insulating materials, and may be formed by CVD, ALD, PVD, spin-on coating, and/or other processes.

Figure 3B:
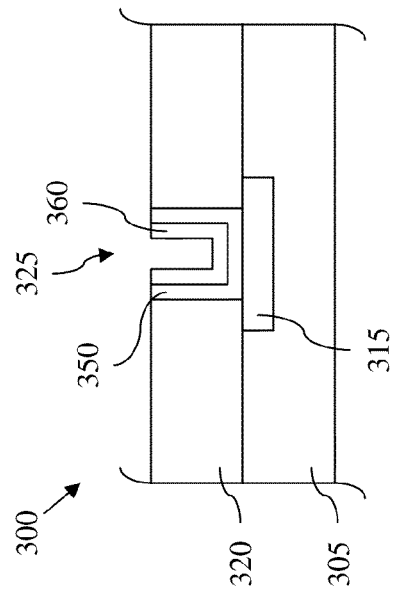

Referring to FIG. 3b, illustrated is a sectional view of the microelectronic device 300 shown in FIG. 3a in a subsequent stage of manufacture according to aspects of the present disclosure, in which the dummy feature 310 has been removed, leaving an opening 325 in the dielectric layer 320. The dummy feature 310 may be removed by one or more wet and/or dry etching processes, chemical etches, and/or plasma etches. Such processing may etch away a substantial portion of the dummy feature 310 while substantially leaving the dielectric layer 320. The dummy feature 310 may also be removed by micromachining, focused ion beam milling, and/or other processes.

Figure 3C:
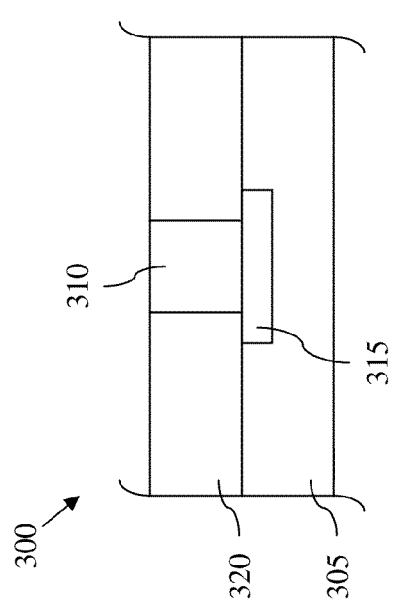

Referring to FIG. 3c, illustrated is a sectional view of the microelectronic device 300 shown in FIG. 3b in a subsequent stage of manufacture according to aspects of the present disclosure in which a semiconductive layer 350 has been formed substantially conforming to the opening 325. The semiconductive layer 350 may comprise amorphous silicon, polysilicon, polyoxide, silicon nitride, silicon dioxide, silicon carbide, photoresist, and/or other materials, and may be formed by CVD, PECVD, PVD, ALD, and/or other processes. The semiconductive layer 350 may also be formed over the dielectric layer 320 and subsequently planarized (e.g., by CMP), etched-back, or otherwise removed except from within the opening 325. The semiconductive layer 350 may also comprise more than one layer.

Figure 3D:
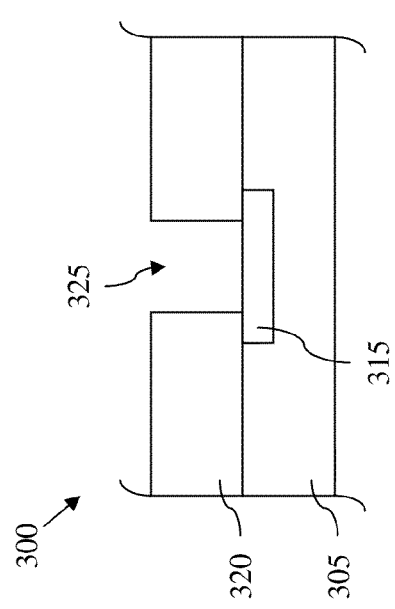

Referring to FIG. 3d, illustrated is a sectional view of the microelectronic device 300 shown in FIG. 3c in a subsequent stage of manufacture according to aspects of the present disclosure in which a metal layer 360 has been formed substantially conforming to the semiconductive layer 350. The metal layer 360 may comprise cobalt, nickel, tungsten, vanadium, bismuth, titanium, tantalum, aluminum, silicide, cobalt silicide, nickel silicide, tungsten silicide, alloys thereof, and/or other materials, and may be formed by CVD, PECVD, PVD, ALD, electroplating, and/or other processes. The metal layer 360 may also be formed over the dielectric layer 320 and subsequently planarized (e.g., by CMP), etched-back, or otherwise removed except from within the opening 325. Although not illustrated as such, the metal layer 360 may also substantially fill the opening 325. The metal layer 360 may also comprise more than one layer.

Figure 3G:
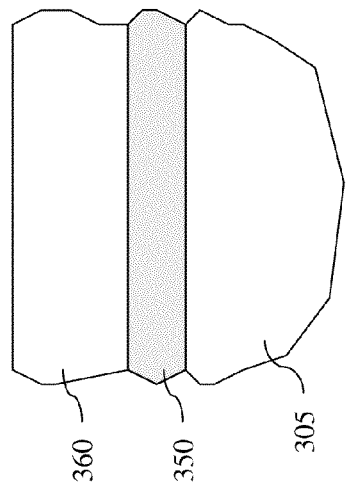
Figure 3H:
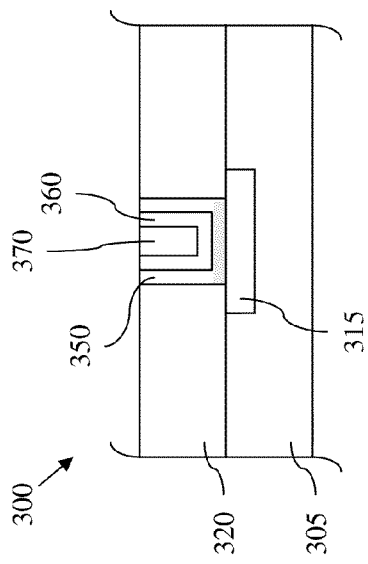
Figure 3E:
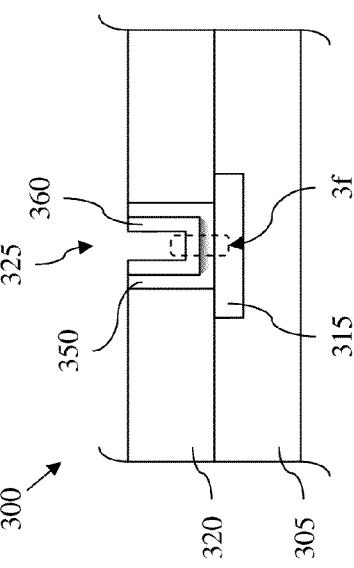

Referring to FIG. 3e, illustrated is a sectional view of the microelectronic device 300 shown in FIG. 3d in a subsequent stage of manufacture according to aspects of the present disclosure in which an ion implant process has been performed to implant impurities into the semiconductive layer 350 through the metal layer 360. The implant process may be substantially similar to the process performed in step 112 shown in FIG. 1. The implant process may also comprise more than one implant process of one or more impurity materials.

Figure 3F:
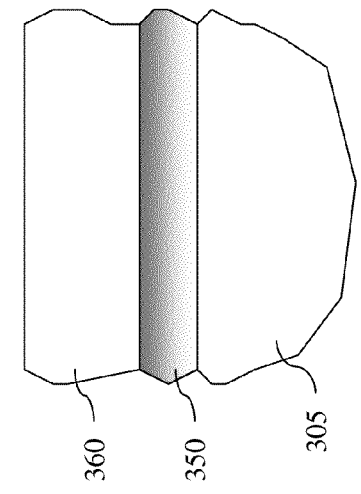

Referring to FIG. 3f, illustrated is an expanded view of a portion of the microelectronic device 300 shown in FIG. 3e. The impurities implanted through the metal layer 360 may not be implanted uniformly through the thickness of the semiconductive layer 350, as shown in FIG. 3f. For example, the impurities implanted into the semiconductive layer 350 may be more concentrated near the interface with the metal layer 360 relative to the concentration near the interface with the landing pad 315.

Referring to FIG. 3g, illustrated is an expanded view of the portion of the microelectronic device 300 shown in FIG. 3f after an anneal process is performed to more uniformly distribute the implanted impurities throughout a greater portion of the thickness of the semiconductive layer 350. In one embodiment, the concentration uniformity of the impurities within at least the portion of the annealed semiconductive layer 350 directly interposing the metal layer 360 and the gate dielectric layer 340 may vary by less than about 20%. For example, the concentration within any predetermined volumetric portion of the region interposing the metal layer 360 and the landing pad 315 may not vary from the average concentration within the region by more than about 20%. In one embodiment, the predetermined volumetric portion of the region may be represented by a cube having side dimensions of about 0.1 μm or more.

Referring to FIG. 3h, illustrated is a sectional view of the microelectronic device 300 in a subsequent stage of manufacture according to aspects of the present disclosure in which one or more subsequent processes have been performed to complete or advance the manufacturing of the device 300. For example, in the illustrated embodiment, the opening 325 has been filled with a plug 370 comprising conductive material, such as may be employed to form a contact to interconnects or other overlying features. Of course, the present disclosure is not limited to such subsequent processing. That is, FIG. 3h is provided to demonstrate, among other things, that the microelectronic device 300 is not necessarily completed after the processing depicted in FIG. 3g.

Referring to FIG. 4, illustrated is a flow-chart diagram of another method 400 of manufacturing a metal-silicide feature according to aspects of the present disclosure. The method 400 includes forming a dummy feature and a dielectric material and removing the dummy feature in steps 402, 404, and 406, respectively. The steps 402, 404, and 406 may be substantially similar to the steps 102, 104, and 106, respectively, shown in FIG. 1.

The method 400 also includes a step 408 in which a metal-silicide layer may be formed in the opening created by removing the dummy feature in step 406. The metal-silicide layer, or at least a portion of it, may be deposited as a metal-silicide layer, in contrast to depositing two separate layers which are subsequently annealed to form a silicide and/or induce interdiffusion.

In one embodiment, the metal-silicide layer is deposited in a CVD, PVD, or other type of deposition chamber employing a metal-silicide target. In another embodiment, the metal silicide layer is deposited in a deposition chamber employing a metal target and a silicon or silicon-containing target. This may be referred to as co-sputtering. The metal-silicide layer may also be deposited by co-flowing a silicon-containing gas with another process gas in a deposition chamber during a deposition process, such as a CVD or PVD process employing a metal target. Examples of such a silicon-containing gas include silane, dichlorosilane, disilane, silicon tetrachloride, trichlorosilane, and/or other materials. The deposition process may be or include an ionized metal plasma PVD process or other types of PVD processes, CVD, PECVD, and other types of deposition processes.

The method 400 may also include a step 410 in which the metal-silicide layer formed in step 408 is annealed. The anneal process may be a rapid thermal anneal and may be performed at temperatures ranging between about 400° C. and about 800° C., possibly for a time period ranging between about 10 seconds and about 1 hour. The anneal may be performed in an inert process environment, such as one substantially comprising nitrogen, argon, helium, and/or other gases. A sintering process may also or alternatively be employed to migrate impurities within the metal-silicide layer.

Figure 5C:
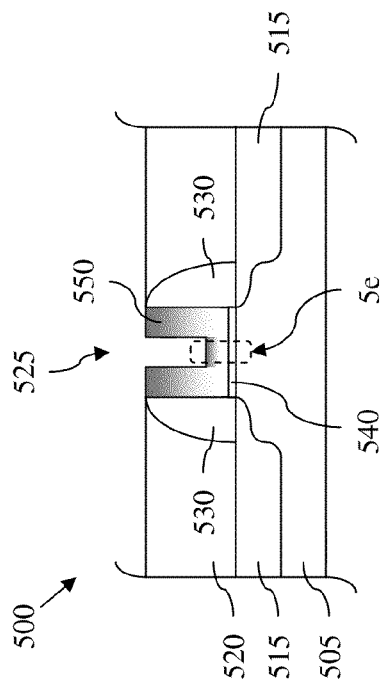
FIGS. 5a-5f are sectional views of at least a portion of another embodiment of a microelectronic device during various stages of manufacture according to aspects of the present disclosure.
Figure 5D:
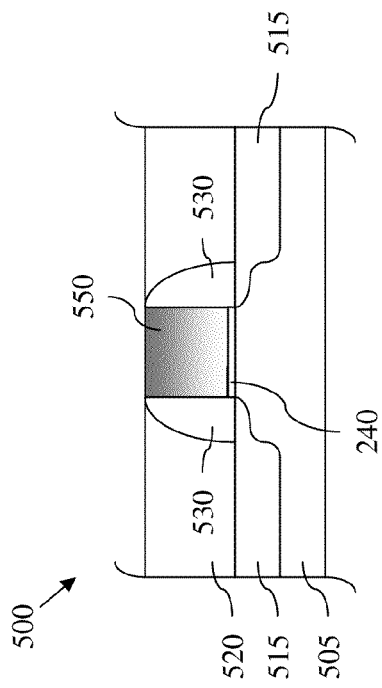
Figure 5A:
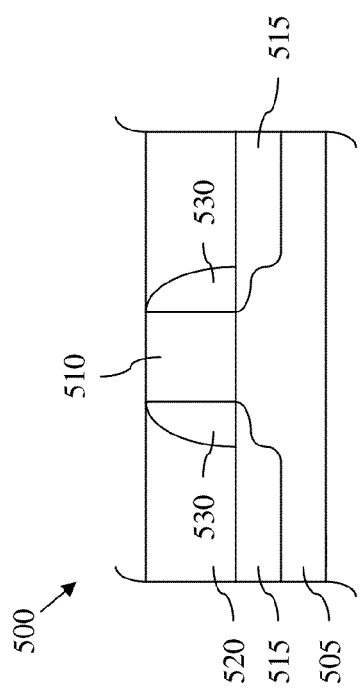

Referring to FIG. 5a, illustrated is a sectional view of at least a portion of another embodiment of a microelectronic device 500 in an intermediate stage of manufacture according to aspects of the present disclosure. The microelectronic device 500 is one environment in which the method 400 shown in FIG. 4 may be employed. For example, the microelectronic device 500 may include a metal-silicide feature, such as a metal-silicide contact, and the method 400 of FIG. 4 may be employed during the fabrication of at least a portion of the metal-silicide feature.

The microelectronic device 500 includes a substrate 505 over which a dummy feature 510 and a dielectric layer 520 are formed. In the illustrated embodiment, the dummy feature 510 is a dummy gate 510, and source/drain regions 515 are formed in the substrate 505 on opposing sides of the dummy gate 510. The microelectronic device 500 may also include spacers 530 formed on opposing sides of the dummy gate 510, or a single spacer 530 substantially surrounding the dummy gate 510.

The substrate 505 may comprise silicon, gallium arsenide, gallium nitride, strained silicon, silicon germanium, silicon carbide, carbide, diamond, and/or other materials. A bulk portion of the substrate 505 may be doped with a P type and/or an N type dopant. In one embodiment, the substrate 505 comprises an SOI substrate, such as a silicon-on-sapphire substrate, a silicon germanium-on-insulator substrate, or another substrate comprising an epitaxial semiconductor layer on an insulator layer. The substrate 505 may also or alternatively comprise a fully depleted SOI substrate having an active layer thickness ranging between about 5 nm and about 200 nm. The substrate 505 may also or alternatively comprise an air gap, such as may be formed in an SON structure.

The dummy gate 510 may comprise one or more layers of conductive, semiconductive, or insulating materials. In one embodiment, the dummy gate 510 comprises polysilicon. The dummy gate 510 may be formed by CVD, PECVD, PVD, ALD, and/or other processes. The dummy gate 510 may be selectively deposited, such as in the shape illustrated in FIG. 5a, or blanket deposited and subsequently patterned by one or more etching or photolithographic processes. The dummy gate 510 may also be formed prior to or after the dielectric layer 520 and/or the spacers 530. The dimensions of the dummy gate 510 may be substantially similar or proportional to the dimensions of a subsequently formed gate electrode. In one embodiment, the dummy gate 510 may not be formed, wherein the subsequently formed gate electrode is formed within an opening in the dielectric layer 520 and/or spacers 530 formed by other processes.

The source/drain regions 515 may be N doped or P doped regions of the substrate 505, and may be formed by one or more implant processes. For example, a first implant process may be employed to form lightly doped regions extending under the spacers 530, and a second implant process may be employed to form heavier doped regions to be contacted by subsequently formed vias or other interconnects. An anneal process may also be employed to laterally diffuse the source/drain regions 515 inward towards a subsequently formed gate electrode.

The dielectric layer 520 and/or the spacers 530 may comprise silicon dioxide, FSG, SILK, BLACK DIAMOND, and/or other insulating materials, and may be formed by CVD, ALD, PVD, spin-on coating, and/or other processes. The spacers 530 may also be shaped by one or more wet and/or dry etching processes, and may be formed as an intermediate step between multiple implants steps performed to form the source/drain regions 515.

Figure 5B:
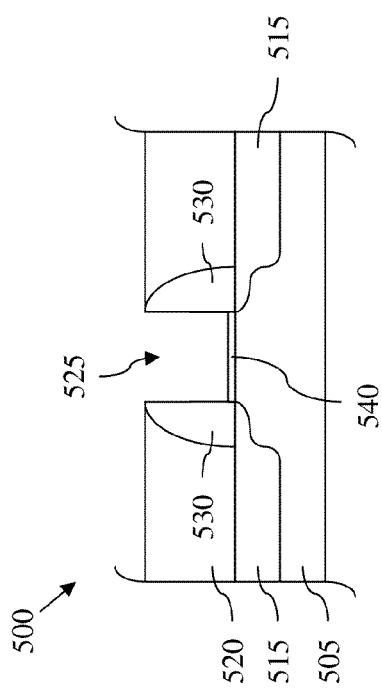

Referring to FIG. 5b, illustrated is a sectional view of the microelectronic device 500 shown in FIG. 5a in a subsequent stage of manufacture according to aspects of the present disclosure, in which the dummy gate 510 has been removed, leaving an opening 525 in the dielectric layer 520. A gate dielectric layer 540 has also been formed over an exposed portion of the substrate 505 in the opening 525.

The dummy gate 510 may be removed by one or more wet and/or dry etching processes, chemical etches, and/or plasma etches. Such processing may etch away a substantial portion of the dummy gate 510 while substantially leaving the dielectric layer 520 and spacers 530 in their as-formed configuration. The dummy gate 510 may also be removed by micromachining, focused ion beam milling, and/or other processes.

The gate dielectric layer 540 may comprise silicon dioxide epitaxially grown from the substrate 505. For example, after the dummy gate 510 has been removed, the exposed portion of the substrate 505 may be cleaned, such as by a deionized water rinse, ashing, solution etching, and the device 500 may be exposed to an oxygen or oxygen-containing environment or process gas, thereby growing a thin layer of silicon dioxide over the substrate 505. Of course, the gate dielectric layer 540 may be formed by one or more additional or alternative processes, and may comprise materials other than or in addition to silicon dioxide, such as silicon nitride, silicon oxynitride, and/or other materials. The gate dielectric layer 540 may also comprise more than one layer.

Referring to FIG. 5c, illustrated is a sectional view of the microelectronic device 500 shown in FIG. 5b in a subsequent stage of manufacture according to aspects of the present disclosure in which a metal-silicide layer 550 has been formed, substantially conforming to the opening 525. The process employed to form the metal-silicide layer 550 may be substantially similar to the process(es) performed in step 408 of the method 400 shown in FIG. 4. The metal-silicide layer 550 may have varying amounts of a metal constituent and a silicide constituent. The metal constituent may comprise cobalt, nickel, tungsten, bismuth, titanium, tantalum, aluminum, gold, silver, and/or other materials. The metal-silicide layer 550 may be formed by co-sputtering and/or other processes, including CVD, PECVD, PVD, and ALD. Such processes may also be employed in conjunction with a silicon-containing gas. Thus, for example, the metal-silicide layer 550 may comprise cobalt silicide, nickel silicide, tungsten silicide, and/or other metal-silicide combinations. The metal-silicide layer 550 may also be formed over the dielectric layer 520 and subsequently planarized (e.g., by CMP), etched-back, or otherwise removed except from within the opening 525. The metal-silicide layer 550 may also comprise more than one layer.

Referring to FIG. 5d, illustrated is a sectional view of another embodiment of the microelectronic device 500 shown in FIG. 5c according to aspects of the present disclosure. The metal-silicide layer 550 may be deposited within the opening 525 such that the opening 525 is substantially filled with the metal-silicide combination. As with the embodiment shown in FIG. 5c, a planarizing, etch-back, or other material removal process may be employed after depositing the metal-silicide layer 550 to render the metal-silicide layer 550 substantially coplanar with the dielectric layer 520. The metal-silicide layer 550 may also comprise more than one layer. Although not illustrated, a seed layer may also be employed, such as may be deposited prior to depositing the metal-silicide layer 550. Such a seed layer may improve the adhesion of the metal-silicide layer 550 within the opening 525.

Figure 5E:
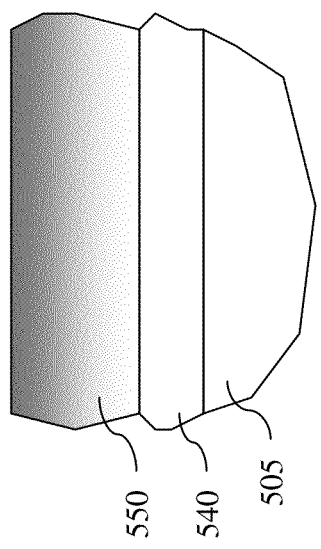

Referring to FIG. 5e, illustrated is an expanded view of a portion of the microelectronic device 500 shown in FIG. 5c. The concentration of the metal constituent of the metal-silicide layer 550 relative to the concentration of the silicide constituent may not be uniform throughout the metal-silicide layer 550. This concentration gradient may be intentionally achieved. For example, in an embodiment in which the metal-silicide layer 550 is formed by co-sputtering employing a metal target and a silicon containing target, the bias of the targets may be varied as the deposition process proceeds and/or to achieve a desired metal/silicide ratio. In one embodiment, the targets may be biased such that a greater concentration of one of the silicide constituent and the metal constituent forms near the interface to the gate dielectric layer 520 and a greater concentration of the other of the silicide constituent and the metal constituent forms distal from the gate dielectric layer 520. Moreover, this concentration gradient may vary among neighboring instances of the microelectronic device 500. Accordingly, neighboring instances of the microelectronic device 500, such as in a memory array, integrated circuit, or complimentary MOS (CMOS) configuration, may have gate electrodes or other features of varying work functions or other electrical characteristics.

Figure 5F:
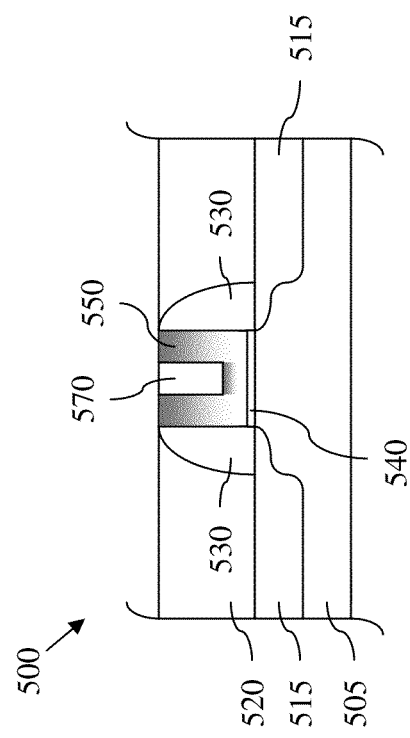

Referring to FIG. 5f, illustrated is a sectional view of the microelectronic device 500 shown in FIG. 5c in a subsequent stage of manufacture according to aspects of the present disclosure in which one or more subsequent processes have been performed to complete or advance the manufacturing of the device 500. For example, in the illustrated embodiment, the opening 525 has been filled with a plug 570 comprising conductive material, such as may be employed to form a contact to interconnects or other overlying features. Of course, the present disclosure is not limited to such subsequent processing. That is, FIG. 5f is provided to demonstrate, among other things, that the microelectronic device 500 is not necessarily completed after the processing depicted in FIG. 5c or FIG. 5d.

Referring to FIG. 6a, illustrated is a sectional view of at least a portion of another embodiment of a microelectronic device 600 in an intermediate stage of manufacture according to aspects of the present disclosure. The microelectronic device 600 is another environment in which the method 400 shown in FIG. 4 may be employed. For example, the microelectronic device 600 includes a metal-silicide feature (shown in subsequent figures), and the method 400 of FIG. 4 may be employed during the fabrication of at least a portion of the metal-silicide feature.

The microelectronic device 600 includes a substrate 605 over which a dummy feature 610 and a dielectric layer 620 are formed. In the illustrated embodiment, the dummy feature 610 is a dummy contact 610, and a landing pad 615 is formed in the substrate 605 underlying the dummy contact 610. The landing pad 615 may also be a contact area of a microelectronic device, such as a source/drain contact of a transistor device.

The substrate 605 may comprise silicon, gallium arsenide, gallium nitride, strained silicon, silicon germanium, silicon carbide, carbide, diamond, and/or other materials. A bulk portion of the substrate 605 may be doped with a P type and/or an N type dopant. In one embodiment, the substrate 605 comprises an SOI substrate, such as a silicon-on-sapphire substrate, a silicon germanium-on-insulator substrate, or another substrate comprising an epitaxial semiconductor layer on an insulator layer. The substrate 605 may also or alternatively comprise a fully depleted SOI substrate having an active layer thickness ranging between about 5 nm and about 200 nm. The substrate 605 may also or alternatively comprise an air gap, such as may be formed in an SON structure. The substrate 605 may also comprise one or more layers of conductive vias, contacts, lines and/or traces extending along and/or through one or more dielectric layers, such as may be employed in an interconnect structure. The landing pad 615 may be integral to or coupled to one such conductive via, contact, line, or trace.

The dummy feature 610 may comprise one or more layers of conductive, semiconductive, or insulating materials. In one embodiment, the dummy feature 610 comprises polysilicon. The dummy feature 610 may be formed by CVD, PECVD, PVD, ALD, and/or other processes. The dummy feature 610 may be selectively deposited, such as in the shape illustrated in FIG. 6a, or blanket deposited and subsequently patterned by one or more etching or photolithographic processes. The dummy feature 610 may also be formed by damascene or dual-damascene processes, and may be formed prior to or after the dielectric layer 620. The dimensions of the dummy feature 610 may be substantially similar or proportional to the dimensions of a subsequently formed metal-silicide feature. In one embodiment, the dummy feature 610 may not be formed, wherein the subsequently formed metal-silicide feature is formed within an opening in the dielectric layer 620 that is formed by other processes.

The dielectric layer 620 may comprise silicon dioxide, FSG, SILK, BLACK DIAMOND, and/or other insulating materials. The dielectric layer 620 may also be formed by CVD, ALD, PVD, spin-on coating, and/or other processes.

Referring to FIG. 6b, illustrated is a sectional view of the microelectronic device 600 shown in FIG. 6a in a subsequent stage of manufacture according to aspects of the present disclosure, in which the dummy feature 610 has been removed, leaving an opening 625 in the dielectric layer 620. The dummy feature 610 may be removed by one or more wet and/or dry etching processes, chemical etches, and/or plasma etches. Such processing may etch away a substantial portion of the dummy feature 610 while substantially leaving the dielectric layer 620. The dummy feature 610 may also be removed by micromachining, focused ion beam milling, and/ or other processes.

Referring to FIG. 6c, illustrated is a sectional view of the microelectronic device 600 shown in FIG. 6b in a subsequent stage of manufacture according to aspects of the present disclosure in which a metal-silicide layer 650 has been formed, substantially conforming to the opening 625. The process employed to form the metal-silicide layer 650 may be substantially similar to the process(es) performed in step 408 of the method 400 shown in FIG. 4. The metal-silicide layer 650 may have varying amounts of a metal constituent and a silicide constituent. The metal constituent may comprise cobalt, nickel, tungsten, bismuth, titanium, tantalum, aluminum, gold, silver, and/or other materials. The metal-silicide layer 650 may be formed by co-sputtering and/or other processes, including CVD, PECVD, PVD, and ALD. Such processes may also be employed in conjunction with a silicon-containing gas. Thus, for example, the metal-silicide layer 650 may comprise cobalt silicide, nickel silicide, tungsten silicide, and/or other metal-silicide combinations. The metal-silicide layer 650 may also be formed over the dielectric layer 620 and subsequently planarized (e.g., by CMP), etched-back, or otherwise removed except from within the opening 625. The metal-silicide layer 650 may also comprise more than one layer.

Referring to FIG. 6d, illustrated is a sectional view of another embodiment of the microelectronic device 600 shown in FIG. 6c according to aspects of the present disclosure. The metal-silicide layer 650 may be deposited within the opening 625 such that the opening 625 is substantially filled with the metal-silicide combination. As with the embodiment shown in FIG. 6c, a planarizing, etch-back, or other material removal process may be employed after depositing the metal-silicide layer 650 to render the metal-silicide layer 650 substantially coplanar with the dielectric layer 620. The metal-silicide layer 650 may also comprise more than one layer. Although not illustrated, a seed layer may also be employed, such as may be deposited prior to depositing the metal-silicide layer 650. Such a seed layer may improve the adhesion of the metal-silicide layer 650 within the opening 625.

Figure 6E:
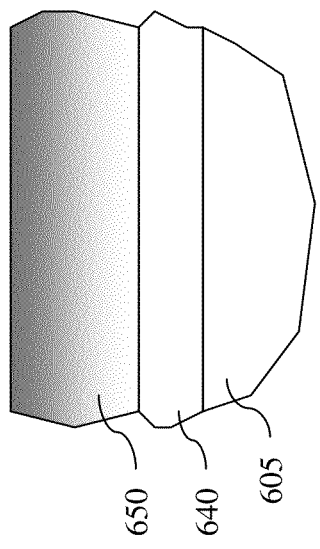

Referring to FIG. 6e, illustrated is an expanded view of a portion of the microelectronic device 600 shown in FIG. 6c. The concentration of the metal constituent of the metal-silicide layer 650 relative to the concentration of the silicide constituent may not be uniform throughout the metal-silicide layer 650. This concentration gradient may be intentionally achieved. For example, in an embodiment in which the metal-silicide layer 650 is formed by co-sputtering employing a metal target and a silicon containing target, the bias of the targets may be varied as the deposition process proceeds and/or to achieve a desired metal/silicide ratio. In one embodiment, the targets may be biased such that a greater concentration of one of the silicide constituent and the metal constituent forms near the interface to the gate dielectric layer 620 and a greater concentration of the other of the silicide constituent and the metal constituent forms distal from the gate dielectric layer 620. Moreover, this concentration gradient may vary among neighboring instances of the microelectronic device 600. Accordingly, neighboring instances of the microelectronic device 600, such as in a memory array, integrated circuit, or complimentary MOS (CMOS) configuration, may have varying work functions, conductivity, or other electrical characteristics.

Figure 6F:
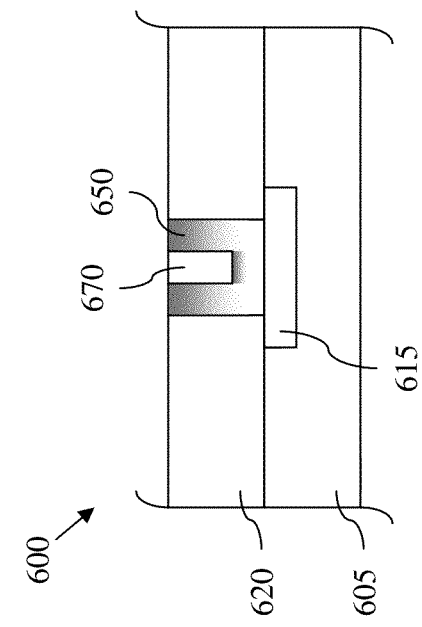

Referring to FIG. 6f, illustrated is a sectional view of the microelectronic device 600 in a subsequent stage of manufacture according to aspects of the present disclosure in which one or more subsequent processes have been performed to complete or advance the manufacturing of the device 600. For example, in the illustrated embodiment, the opening 625 has been filled with a plug 670 comprising conductive material, such as may be employed to form a contact to interconnects or other overlying features. Of course, the present disclosure is not limited to such subsequent processing. That is, FIG. 6f is provided to demonstrate, among other things, that the microelectronic device 600 is not necessarily completed after the processing depicted in FIG. 6c or FIG. 6d.

Figure 7:
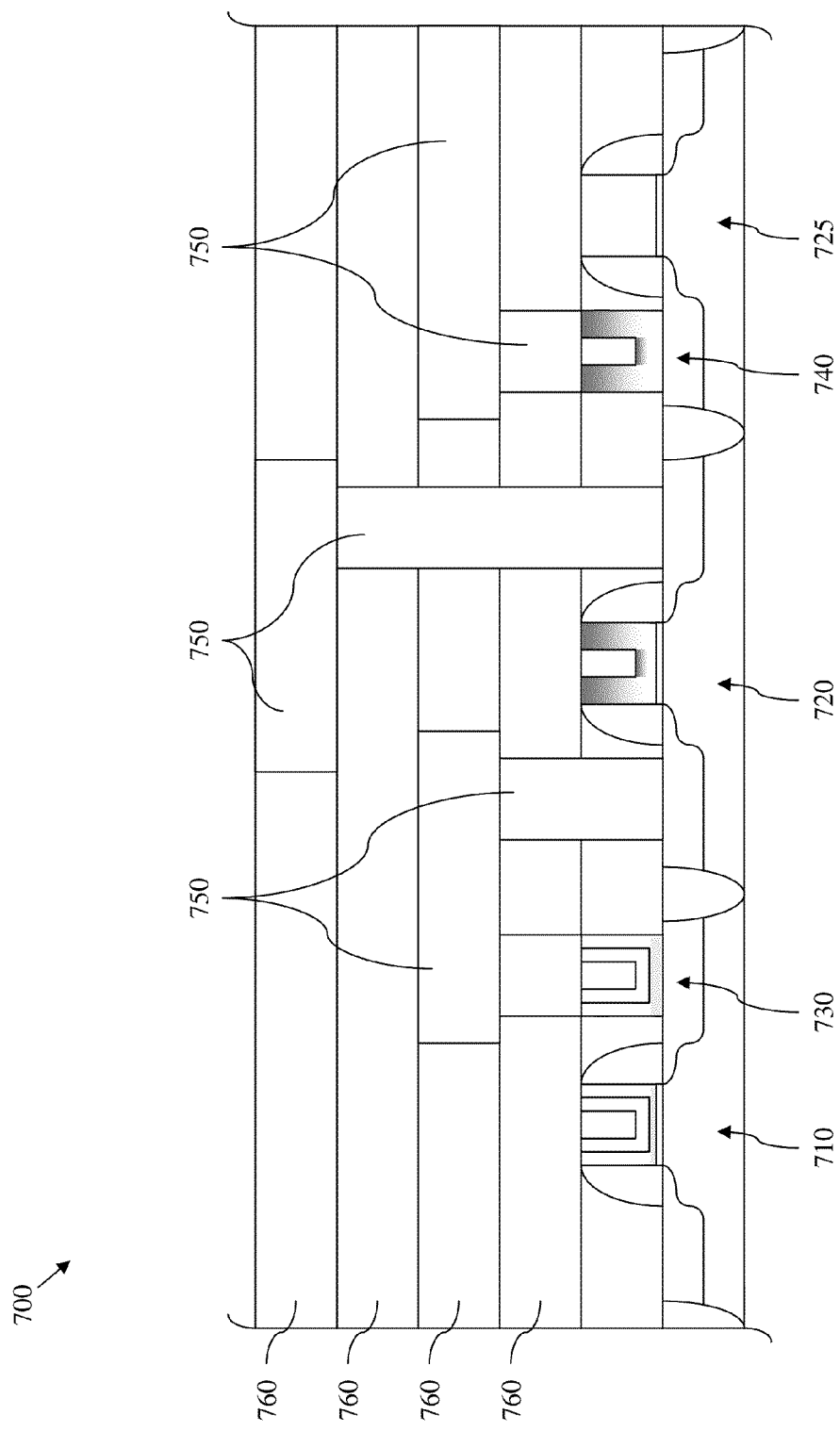
FIG. 7 is a sectional view of at least a portion of one embodiment of an integrated circuit device constructed according to aspects of the present disclosure.

Referring to FIG. 7, illustrated is a sectional view of one embodiment of an integrated circuit device 700 constructed according to aspects of the present disclosure. The integrated circuit device 700 is one environment in which the metal-silicide features 200, 300, 500, and 600 shown in FIGS. 2h, 3h, 5f, and 6f, respectively, among others discussed herein, may be implemented.

For example, the integrated circuit device 700 may include a transistor device 710 that is substantially similar to the microelectronic device 200 shown in FIG. 2, and/or may include a transistor device 720 that is substantially similar to the microelectronic device 500 shown in FIG. 5. Of course, the integrated circuit device 700 may include more than one instance of the transistor device 710 and/or the transistor device 720, and possibly other types of transistor devices 725.

The integrated circuit device 700 may also include a contact 730 that is substantially similar to the metal-silicide feature 300 shown in FIG. 3, and/or may include a contact 740 that is substantially similar to the metal-silicide feature 600 shown in FIG. 6. The integrated circuit device 700 may include more than one instance of the contact 730 and/or the contact 740, as well as other types of contacts, vias, traces, and/or interconnects. For example, in the illustrated embodiment, the integrated circuit device 700 includes interconnects extending 750 along and/or through one or more insulating layers 760. The interconnects 750 may comprise tantalum nitride, copper, aluminum, tungsten, gold, and/or other materials, possibly including one or more refractory layers or linings, and may be formed by CVD, PECVD, PVD, ALD, and/or other processes. The insulating layers 760 may comprise silicon dioxide, FSG, SILK, BLACK DIAMOND, and/or other insulating materials, and may be formed by CVD, ALD, PVD, spin-on coating, and/or other processes. The interconnects 750 may interconnect the devices 710, 720, 725, and/or other devices integral to, proximate, or remote from those shown in FIG. 7.

Thus, the present disclosure provides a method of manufacturing a microelectronic device including, in one embodiment, forming an opening in a dielectric layer located over a substrate, forming a semiconductive layer substantially conforming to the opening, and forming a conductive layer substantially conforming to the semiconductive layer. At least a portion of the semiconductive layer is doped by implanting through the conductive layer. The semiconductive layer and the conductive layer may then be annealed.

The present disclosure also introduces a microelectronics device including, in one embodiment, a dielectric layer located over a substrate and having an opening extending therethrough, a doped semiconductive layer substantially lining the opening and having a first substantially U-shaped profile within the opening, and a conductive layer substantially lining the semiconductive layer and having a second substantially U-shaped profile within the opening. At least portions of the doped semiconductive layer and the conductive layer are inter-diffused. A bulk conductive material may fill the second substantially U-shaped profile within the opening.

Another embodiment of a method of manufacturing a microelectronics device according to aspects of the present disclosure includes forming a dielectric layer substantially surrounding a dummy feature located over a substrate, removing the dummy feature to form an opening in the dielectric layer, and forming a metal-silicide layer substantially conforming to the opening by co-flowing a gas comprising silicon during a metal deposition process. The metal-silicide layer may then be annealed.

In another method of manufacturing a microelectronics device according to aspects of the present disclosure, a dielectric layer is formed substantially surrounding a dummy feature located over a substrate. The dummy feature is removed to form an opening in the dielectric layer. A metal-silicide layer is formed substantially conforming to the opening by co-sputtering during a deposition process employing a metal target and a silicon-containing target. The metal-silicide layer may then be annealed.

Another embodiment of a method of manufacturing a microelectronics device according to aspects of the present disclosure includes forming a dielectric layer substantially surrounding a dummy feature located over a substrate, removing the dummy feature to form an opening in the dielectric layer, and forming a metal-silicide layer substantially conforming to the opening by a metal deposition process employing a target comprising metal and silicon. The metal-silicide layer may then be annealed.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microelectronics device comprising:
   a dielectric layer located over a substrate and having an opening extending therethrough;
   a dielectric material layer disposed within the opening, the dielectric material layer being different than the dielectric layer;
   a doped semiconductive layer substantially lining the opening and having a first substantially U-shaped profile within the opening, wherein a portion of the doped semiconductive layer physically contacts a portion of the dielectric layer,
   a conductive layer substantially lining the doped semiconductive layer and having a second substantially U-shaped profile within the opening, wherein portions of the doped semiconductive layer and the conductive layer are interdiffused; and
   a bulk conductive material filling the second substantially U-shaped profile within the opening,
   wherein the doped semiconductive layer includes a region having an impurity concentration disposed between the dielectric layer and the conductive layer, the impurity concentration adjacent the conductive layer being higher than the impurity concentration adjacent the dielectric layer.

2. The microelectronics device of claim 1 wherein a portion of the bulk conductive material is a transistor gate electrode.

3. The microelectronics device of claim 1 wherein a portion of the bulk conductive material is a contact substantially spanning a thickness of an insulating layer located over the substrate.

4. The microelectronics device of claim 1 wherein a collective thickness of the doped semiconductive layer and the conductive layer within the opening is substantially less than a width of the opening.

5. The microelectronics device of claim 1 wherein the conductive layer comprises a material selected from the group consisting of: cobalt silicide, nickel, nickel silicide, platinum, platinum silicide, tungsten, tungsten silicide, titanium, titanium silicide, tantalum, tantalum silicide, palladium, and palladium silicide.

6. The microelectronics device of claim 1 including a gate dielectric layer disposed in the opening between the substrate and the doped semiconductive layer.

7. The microelectronics device of claim 1 wherein the impurity concentration within a defined volumetric portion of the region varies from an average impurity concentration of the region by no more than about 20%.

8. The microelectronics device of claim 7 wherein the defined volumetric portion is a cube having side dimensions greater than or equal to about 0.1 μm.

9. The microelectronics device of claim 1 wherein the region has a first impurity concentration near the gate dielectric layer and a second impurity concentration near the conductive layer, a difference between the first and second impurity concentrations being no more than about 20%.

10. The microelectronics device of claim 1, wherein the portion of the doped semiconductive layer includes a sidewall spacer.

11. The microelectronics device of claim 1, wherein the dielectric material layer includes one of silicon nitride and silicon oxynitride.

12. A device comprising:
    a semiconductor substrate;
    a dielectric layer disposed over the semiconductor substrate, wherein the dielectric layer has first and second openings extending therethrough; and
    a gate structure disposed within the first opening of the dielectric layer, wherein the gate structure includes:
       a gate dielectric layer disposed over the semiconductor substrate within the first opening; and
       a first metal-silicide layer disposed over the gate dielectric layer, wherein the metal-silicide layer has a concentration gradient between a metal constituent and a silicide constituent, wherein the first metal-silicide layer has a substantially U-shaped profile; and
       a conductive layer disposed over the first metal-silicide layer; and
    a contact structure disposed within the second opening of the dielectric layer, wherein the contact structure includes a second metal-silicide layer disposed directly on the semiconductor substrate within the second opening such that the second metal-silicide layer physically contacts the semiconductor substrate, wherein the second metal-silicide layer has a substantially U-shaped profile.

13. The device of claim 12 wherein:
    the gate dielectric layer and first metal-silicide layer form an interface; and
    the concentration gradient of the first metal-silicide layer is such that a greater concentration of one of the metal and silicide constituent forms near the interface and a greater concentration of the other of the metal and silicide constituent forms distal from the interface.

14. The device of claim 12 wherein the first metal-silicide layer is a nickel silicide, cobalt silicide, or tungsten silicide layer.

15. The device of claim 12 wherein:
the dielectric layer includes another opening extending therethrough, wherein another gate structure is disposed within the another opening, the another gate structure including:
the gate dielectric layer disposed over the semiconductor substrate within the another opening; and
another metal-silicide layer disposed over the gate dielectric layer, wherein the another metal-silicide layer has a concentration gradient between a metal constituent and a silicide constituent, the concentration gradient of the another metal-silicide layer being different than the concentration gradient of the first metal-silicide layer.

16. A device comprising:
a gate structure disposed within a first opening of a dielectric layer, wherein the gate structure includes:
a metal-silicide layer disposed within the first opening, wherein the metal-silicide layer has a concentration gradient between a metal constituent and a silicide constituent, wherein the metal-silicide layer has a substantially U-shaped profile; and
a conductive layer disposed over the metal-silicide layer;
a doped semiconductive layer substantially lining a second opening of the dielectric layer and having a first substantially U-shaped profile within the second opening, wherein a portion of the doped semiconductive layer physically contacts a portion of the dielectric layer; and
a conductive layer substantially lining the doped semiconductive layer and having a second substantially U-shaped profile within the second opening, wherein portions of the doped semiconductive layer and the conductive layer are interdiffused.

17. The device of claim 16, wherein the gate structure includes a dielectric material layer disposed within the opening, the dielectric material layer being different than the dielectric layer.

18. The device of claim 16, wherein the metal-silicide layer defines a recess, and
wherein the conductive layer is disposed within the recess.

19. The device of claim 16, wherein a concentration of the silicon constituent adjacent a bottom of the opening is greater than a concentration of the metal constituent adjacent the bottom of the opening.

20. The device of claim 16, wherein the metal silicide layer physically contacts the dielectric layer.

* * * * *